United States Patent [19]

Penfold et al.

[11] 4,116,793

[45] Sep. 26, 1978

[54] GLOW DISCHARGE METHOD AND APPARATUS

[75] Inventors: Alan S. Penfold, Playa del Rey; John A. Thornton, Los Angeles, both of Calif.

[73] Assignee: Telic Corporation, Santa Monica, Calif.

[21] Appl. No.: 801,857

[22] Filed: May 31, 1977

Related U.S. Application Data

[60] Division of Ser. No. 535,429, Dec. 23, 1974, Pat. No. 4,041,353, which is a continuation of Ser. No. 254,504, May 18, 1972, abandoned, and a continuation-in-part of Ser. No. 178,240, Sep. 7, 1971, Pat. No. 3,884,793.

[51] Int. Cl.$^2$ ............................................. C23C 15/00
[52] U.S. Cl. ................................ 204/192 R; 204/298; 313/153; 313/161; 313/187; 313/210; 313/217
[58] Field of Search ........... 204/192 R, 192 C, 192 D, 204/298; 313/153, 157, 161, 187, 210, 217; 315/267, 344

[56] References Cited

U.S. PATENT DOCUMENTS

| 3,325,394 | 6/1967 | Kay et al. ............................. 204/298 |
| 3,669,860 | 6/1972 | Knowles et al. ...................... 204/192 |
| 3,669,861 | 6/1972 | Cash, Jr. et al. ..................... 204/192 |
| 3,676,320 | 7/1972 | Christensen .......................... 204/192 |

FOREIGN PATENT DOCUMENTS 1,169,748 11/1969 United Kingdom ..................... 204/298
1,169,747 11/1969 United Kingdom ..................... 204/298

*Primary Examiner*—Aaron Weisstuch
*Attorney, Agent, or Firm*—Fulwider, Patton, Rieber, Lee & Utecht

[57] ABSTRACT

A method and apparatus for providing a completely closed plasma trap in an r.f. type glow discharge system to enable enhanced sputtering from a pair of electrodes so that substrates may be suitably coated. The electrode pairs may be post type, hollow or planar, in various shapes with and without end wings. All configurations utilize a cooperating magnetic field, provided by field coils external or internal to the electrodes, the magnetic field being shaped to define with the electrodes at least one plasma containing trap having axial symmetry imposed by the magnetic field and/or the electrode structure. The trap may be defined by the pair of electrodes acting in concert with each other and the magnetic field, one or more traps may be defined separately by each electrode and the magnetic field, or both types of traps may exist simultaneously in a hybrid situation. Means are also disclosed for mounting, centering, cooling, assembling and making electrical contact with various of the electrode structures. Means are further disclosed for protecting various structural elements from undesired exposure to plasma, preventing conductive plating of insulators, due to undesired deposition of target material, and shielding the entire glow discharge system to prevent undesired r.f. radiation leakage to the surrounding environment.

25 Claims, 30 Drawing Figures

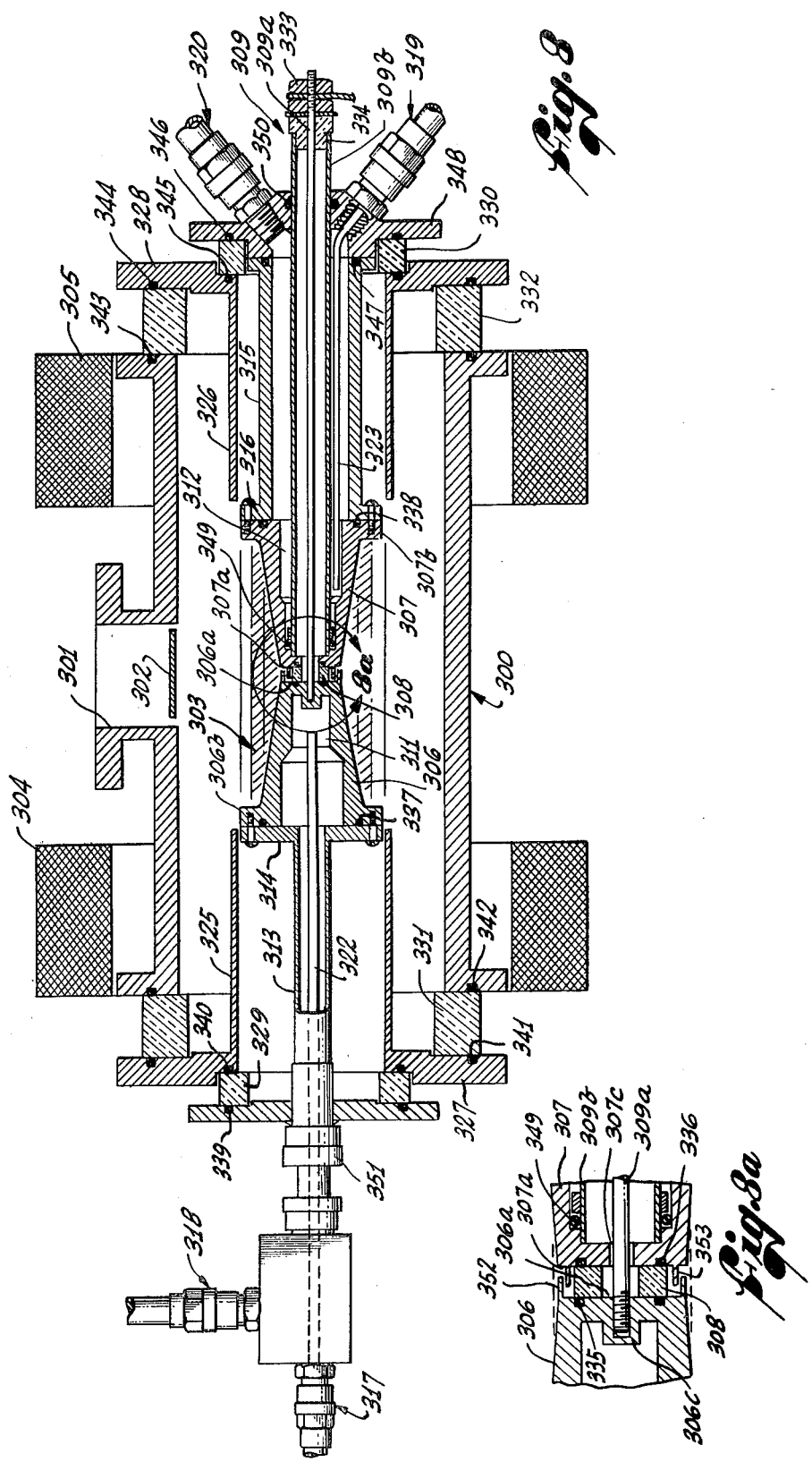

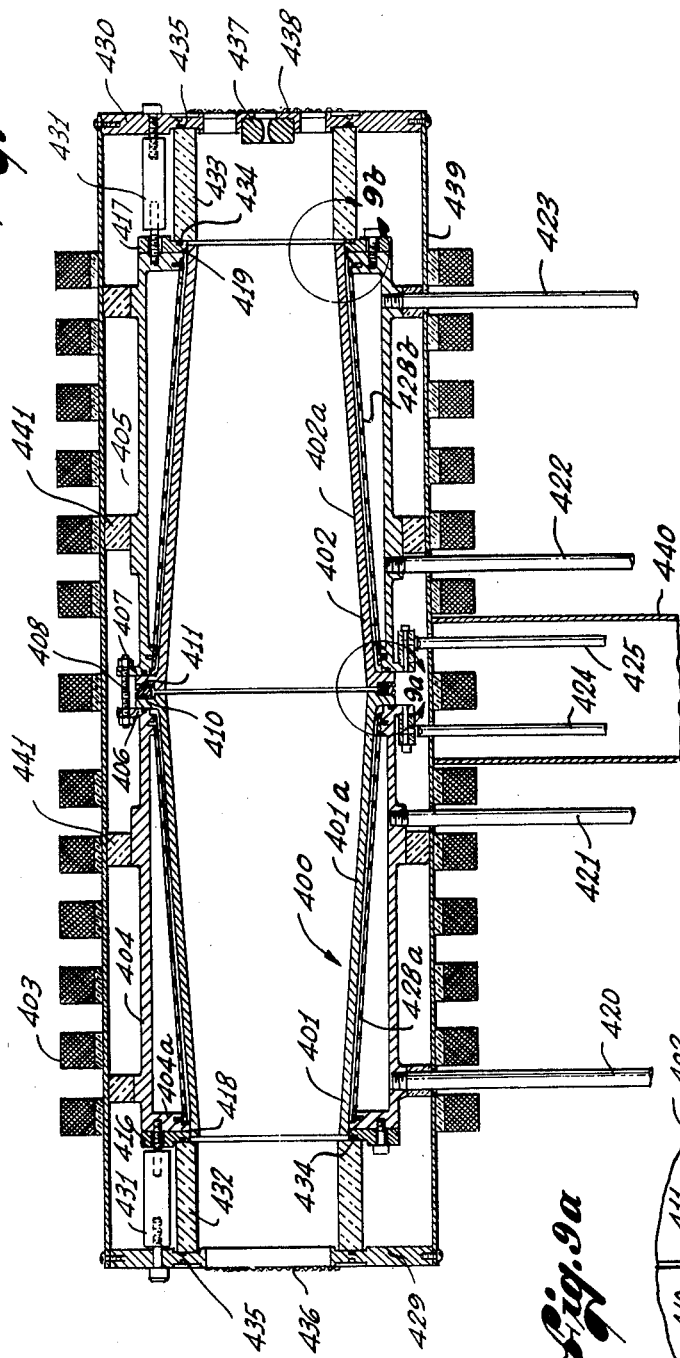
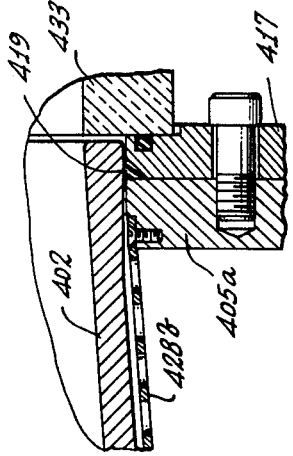
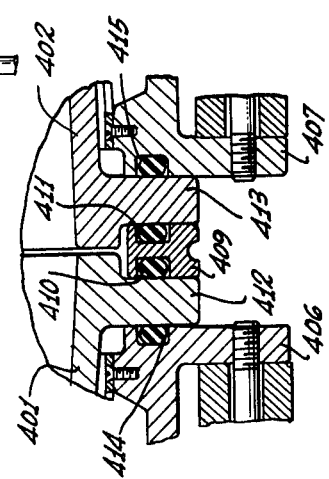

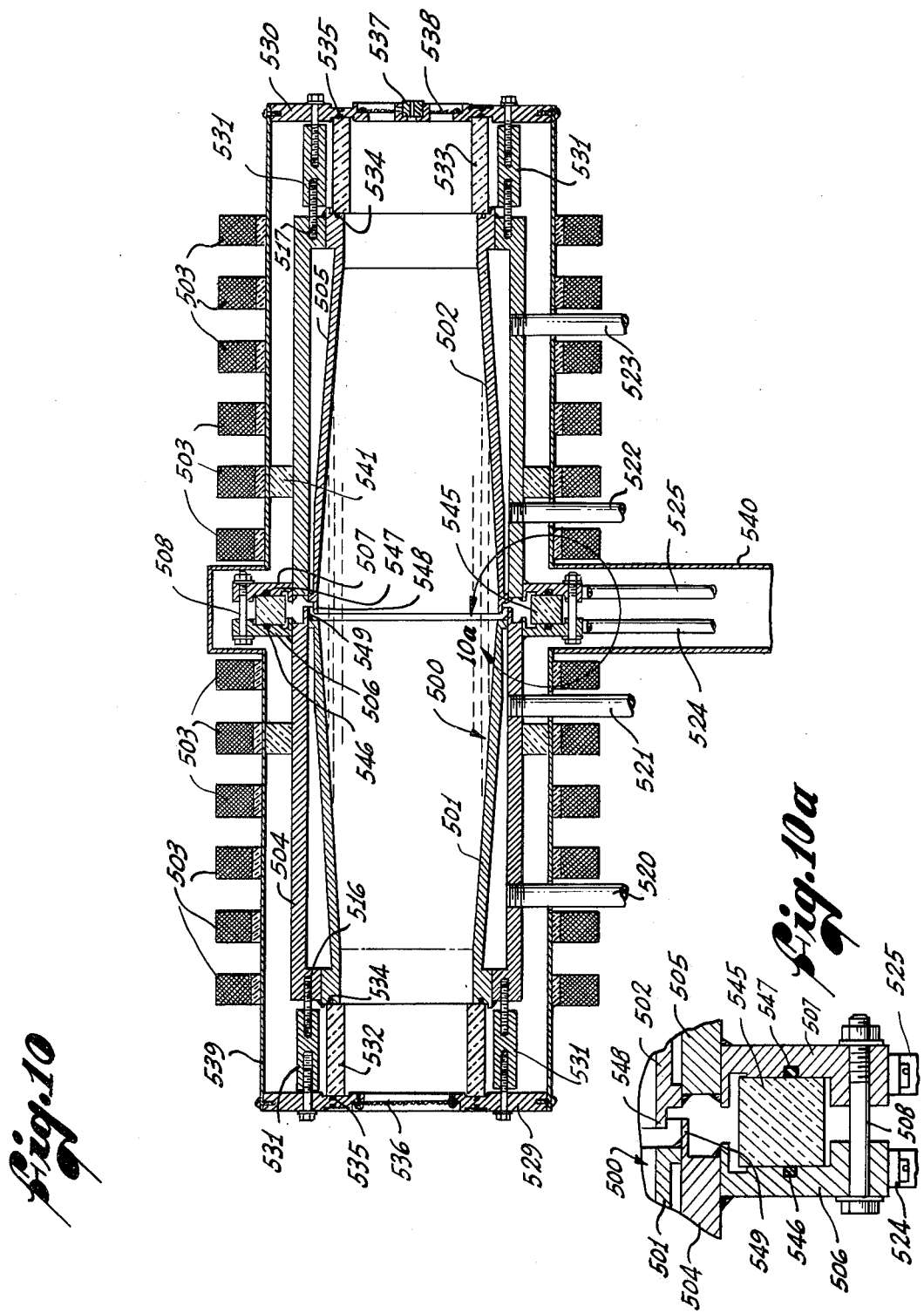

GLOW DISCHARGE METHOD AND APPARATUS

CROSS-REFERENCES TO RELATED APPLICATIONS

This is a division of application Ser. No. 535,429, filed Dec. 23, 1974, now U.S. Pat. No. 4,041,353, which is a continuation of Ser. No. 254,504, filed May 18, 1972, now abandoned, and a continuation-in-part of Ser. No. 178,240, filed Sept. 7, 1971, now U.S. Pat. No. 3,884,793. All of the disclosure of Ser. No. 178,240 is specifically incorporated by reference in this application.

BACKGROUND OF THE INVENTION

This invention relates generally to improvements in glow discharge systems and, more particularly, to a new and improved method and apparatus utilizing electrode type glow discharge devices to enable enhancement of r.f. sputtering and related glow discharge applications, whereby improved economy, efficiency, and overall performance is facilitated by suitable choice of electrode and magnetic field configurations.

A wide variety of electrode type glow discharge devices have been developed and used for sputtering a suitable cathode target material onto a substrate. Much of the literature describing prior art efforts in this area is referenced in the aforementioned copending application Ser. No. 178,240.

In the sputtering process, a target composed of the material to be deposited on a substrate is placed within a gas discharge environment, and this target is electrically connected as a cathode electrode. Ions from the gas discharge bombard the target and drive off, that is, sputter, atoms of the target material. The substrate or item to be coated is suitably located with respect to the cathode, so that it is in the path of the sputtered atoms. Accordingly, a coating of the target material forms on the substrate surface exposed to the impinging sputtered atoms.

The sputtered yield (atoms sputtered per incident ion) depends on the energy of the incident ion upon the target surface, the yield increasing with increasing ion energy. Thus, the sputtering rate is a function of both the rate at which ions impact on the cathode surface and the energy of the bombarding ions. The ion energy and rate of impact is dependent upon the rate of ionization of gas in the glow discharge and the location of the region of ionization with respect to the cathode. In this regard, it is desirable that ions be produced as close as possible to the cathode surface, so that there is a greater likelihood of the ions being drawn to the cathode rather than being lost to adjacent structures such as the walls of the discharge chamber.

In the case where the target electrode is also the primary cathode for maintaining the gas discharge, the ionization in such a discharge is maintained largely by the "primary electrons" exiting from the cathode sheath adjacent the cathode, the primary electrons having been initially emitted as secondary electrons released from the cathode target surface by impact of the incident ions and by photo-emission. These secondary electrons are accelerated in the cathode sheath and become the so-called primary electrons in glow discharge theory. It is these electrons which produce ionization by colliding with the neutral gas atoms within the sheath and the volume of the glow discharge. The latter volume, outside the cathode sheath, is essentially a region of nearly uniform electrical potential consisting of a mixture of gas atoms, ions and electrons and is referred to as the "plasma".

The mean free path of the primary electrons in the plasma increases with the energy of these primary electrons and, hence, with the voltage applied to the discharge, and also varies inversely with the gas pressure in the discharge chamber. Therefore, when the discharge is operated at low pressures and high voltages in order to maximize ion bombarding energies, the resulting primary electrons acquire high energies with the consequence that they either produce ions at a point far from the cathode, or are lost to the walls of the discharge chamber before they produce any ionization at all. Hence, the ionization process is favored by increasing the gas pressure in the discharge. However, such an increase in the gas pressure reduces the energy of the ions bombarding the cathode target surface and severely dissipates the motions of the sputtered target material in its migration to the substrate to be coated so that the sputtered atoms are caused to follow non-linear paths. As a result, some of the basic advantages of the sputtering process are lost by high pressure operation.

Accordingly, a glow discharge technique is desired which permits an intense glow discharge to be maintained over the target surface at relatively low gas pressures and at lower voltages than have heretofore been necessary. Glow discharge systems suitable for such operation in connection with sputtering of electrically conductive materials and related applications are disclosed in the aforementioned copending parent application Ser. No. 178,240. However, it is well known in the plasma physics arts that the conventional methods of d.c. sputtering for conductive target materials are not applicable to the sputtering of electrically insulating target materials, since accumulation of electrical charge on the insulating target material limits the bombarding ion current flow to a value that is too small for practical applications.

The difficulties encountered in attempting to d.c. sputter material from an electrically insulating target have generally been overcome by using the technique of r.f. sputtering whereby an electrically conducting plate is placed behind and closely adjacent a dielectric target to be sputtered, and the conducting plate is biased by a high frequency potential, typically in the megacycle range. Accordingly, an r.f. dielectric current passes through the insulating target to effectively remove any charge accumulation from the target surface and enable ion bombardment sputtering on a sustained basis.

In recent years, the technique of r.f. sputtering has been the subject of increasing interest for depositing coatings of semiconducting and insulating materials, as well as for depositing coatings of the conductive materials with which the aforementioned patent application Ser. No. 178,240 is primarily concerned. For example, the use of sputter deposited insulators such as aluminum oxide has expanded from the original thin film electronics applications to the provision of relatively thick coatings for the protection of machine parts against corrosion and wear. In both of these latter applications, it is desirable that large areas be sputter coated at relatively high deposition rates.

A wide variety of r.f. sputtering systems has been disclosed by the prior art. Illustrative examples of such systems are set forth in a paper by G. S. Anderson, William N. Mayer, and G. K. Wehner, appearing in the *Journal of Applied Physics,* Volume 33, No. 10, October 1962, pages 2991–2992; a paper by P. D. Davidse and L. I. Maissel, appearing in the *Journal of Applied Physics,* Volume 37, No. 2 February 1966, pages 574–579; a paper by L. Holland, T. Putner and G. N. Jackson, appearing in the *Journal of Scientific Instruments* (J. Phys. E, Ser. 2), Vol. 1, January 1968, pages 32–34; U.S. Pat. No. 3,305,473 issued to R. M. Moseson in February, 1967; an article by B. A. Probyn appearing in the magazine *Vacuum,* Volume 18, No. 5, May 1968, pages 253–257; a paper by P. Beucherie, M. Block, and J. G. Wurm, appearing in the *Journal of the Electrochemical Society,* Volume 116, No. 1, January 1969, pages 159–160; an article by F. Kloss and L. Herte, appearing in *SCP and Solid State Technology* in December, 1967, pages 45–49, 75.

Most of the prior art r.f. sputtering devices have involved the use of planar target configurations, oftentimes with combined r.f. and d.c. assist discharges, and some sputtering devices have made use of externally applied magnetic fields.

A wide variety of different r.f. sputtering structural configurations have been developed and are described in the literature, including the so called "grounded r.f. plasma diode", "double electrode" configurations, glow discharge triode systems, tent arrangements, post-type electrode configurations, and structures which include thermionic filaments.

Unfortunately, however, while there has been constant improvement, change and evolution of methods and apparatus in the glow discharge field, each of the prior art systems is characterized by a number of deficiencies which detract from their suitability for various glow discharge and sputtering applications. These problems include high cost, complexity, inefficiency, low sputtering yield, the occurrence of sputtering from undesired surfaces within the apparatus, small usable deposition area, high voltage requirements, substantial coupling between the processes that maintain the plasma discharge and those that control the sputtering rate with consequent severe limitations upon the operational range of the apparatus, high gas pressure requirements, lack of versatility, r.f. leakage, dependence upon target to substrate distance, deposited film contamination, the existence of ion density gradients in the plasma region that bathes the target, non-uniform sputtering, undue and unavoidable substrate heating, the requirement for multiple power supplies, impractibility of scaling to large target sizes, and end losses causing axial variations in the sputtering rate and limiting low pressure performance.

Hence, those concerned with the development and use of glow discharge systems have long recognized the need for improved methods and apparatus in this field to facilitate more versatile and efficient glow discharge systems useful for such applications as sputtering, polymerization, vapor deposition, light sources and radiation sources, which are economical, efficient and avoid the aforedescribed difficulties encountered with prior art systems. The present invention clearly fulfills this need.

SUMMARY OF THE INVENTION

Briefly, and in general terms, the present invention provides a new and improved method and apparatus in the glow discharge field wherein a pair of electrodes and a magnetic field are appropriately shaped and located relative to each other to cooperatively define at least one completely closed plasma trap in a glow discharge system. Glow discharge systems embodying the teachings of the present invention are also physically characterized by axial symmetry imposed by the magnetic field configuration and/or the electrode structure. The invention uniquely provides a completely closed plasma trap in an r.f. glow discharge environment.

In accordance with the present invention, an efficient glow discharge is created so that a minimum energy cost is paid per ion created. In addition, ions are created in a region located with respect to the target so that a very high fraction of the ions are used for sputtering. Furthermore, the plasma discharge is distributed over the target surface in a controlled manner whereby a source of sputtered material having desired geometric distribution is provided. Hence, both uniform and deliberately nonuniform sputtering characteristics are contemplated.

The present invention provides a plasma trap wherein the motion of the primary electrons emitted from the cathode target is restricted both radially and axially by a plasma trap, causing these primary electrons to remain near the target surface until the bulk of their energy has been expended as useful work in ionizing collisions which generate additional plasma. Complete containment by a trap is defined herein as containing substantially all, i.e., the vast majority, of the primary electrons which still have sufficient energy left to generate additional ions, i.e., the electrons which are not contained by the trap do no substantial ionizing work.

The plasma trap is achieved by a combination of electron reflection from surfaces at cathode potential, and electron deflection by a magnetic field, in a low gas pressure environment. Plasma is completely contained in the discharge system of the present invention by a trap which closes all six sides of the conventinally visualized rectilinear volume, four of the six sides, as seen in a cross-section of the plasma trap, being defined by magnetic field lines and electrode surfaces, the remaining two sides being closed by the axial symmetry of the system. This axial symmetry is provided by the magnetic field and/or the electrode structure.

As primary electrons are ejected into the trap, their energy is used to make additional ions in the plasma. When the primary electrons have given up essentially all of their useful energy in making ions, they are of no further value for ionization purposes, and they are then used for maintaining necessary current flow in the overall electrical system. This current flow is provided by electrons, ions, and a combination of both.

Briefly, in presently preferred exemplary embodiments of the invention, double electrode configurations are provided which yield high cathode current densities at moderate to low voltages and at relatively low ambient gas pressures. In normal r.f. operation in the glow discharge system, each of the electrodes in the electrode pair can be anode and cathode with respect to each other, whereas it can be shown that both electrodes behave as cathodes with respect to the plasma throughout a major fraction of the r.f. cycle. In this regard, for only very brief periods of time on alternate half cycles, the electrodes become anodes with respect to the plasma. However, the ions in the plasma and the cathode sheath essentially behave as though they were in a d.c. glow discharge environment with both electrodes behaving as cathodes, essentially all of the time.

Three principle classes of electrode types are taught by the present invention wherein (a) plasma is generated on the outside of a pair of post type electrodes, (b)

plasma is generated within a pair of hollow electrodes and (c) plasma is generated adjacent the surface of relatively thin, planar or curved sheet-like electrodes. All configurations utilize a cooperating magnetic field, using field coils either external or internal to the particular electrode structure, the magnetic field being shaped to define with the particular electrode structure at least one plasma containing trap having the aforementioned axial symmetry imposed by the magnetic field and/or the electrode structure. The shape and strength of the magnetic field can be adjusted to confine the plasma in the trap and eliminate end losses. The trap may be defined by the pair of electrodes acting in concert with each other and the magnetic field to define a single plasma trap. Alternatively, each electrode may cooperate with the magnetic field to define a separate trap from the trap defined by the remaining electrode and a magnetic field. In addition, both types of traps may be used simultaneously in a hybrid situation wherein separate traps are defined by the magnetic field and each electrode, as well as a trap being defined by both electrodes in concert and the magnetic field. Furthermore, in accordance with the invention, it is contemplated that a plurality of plasma traps may be defined by each individual electrode and the magnetic field.

Hence, the aforementioned electrode configurations essentially rely on the simultaneous use of magnetic and electric trapping of high speed electrons wherein the trap is formed as a consequence of the intersection of individual magnetic field lines with a cathode sheath at enough places to effectively close the trap on all sides. Such configurations are extremely efficient in their operation, and by adjusting the magnetic field strength as current is varied, operation can be achieved over a wide range of current values with little or no change in required voltage.

For purposes of sputtering, the surface areas of the target electrode are fabricated of the material to be sputtered (either made of the material or coated therewith) and an ambient gas with good sputtering characteristics, such as argon, neon or the like, is employed, or other gases may be used to cause reactive sputtering to occur.

Post type and hollow cathode configurations may utilize end wings or flanges in some configurations to aid in closing the plasma trap, or the wings may be dispensed with entirely if the trap boundaries can be completely defined by the remaining electrode structure and the magnetic field. Where wings are used, they are made large enough to effectively close the trap, or the magnetic field strength would have to be increased to the point where the economical advantages of the system might be diminished. In this connection, wing size is directly related to the space required for the primary electrons to lose their useful energy in making additional ions.

The teachings of this invention may be considered as a method and apparatus for providing a plasma trap of such efficiency that the replenishing requirements for sustaining a plasma within the trap are minimized to the point that the burden normally placed on the target as a cathode does not interfere in any substantial way with the sputtering process. Hence, the process of sustaining an intense plasma discharge over the target surface is only very weakly coupled to the sputtering process itself. In this regard, making minor adjustments in the magnetic field strength is all that is required to facilitate a wide range of sputtering voltages at a given working gas pressure and sputtering current. Hence, the invention removes the requirement for any assist discharge, second power supply, and other like disadvantages of prior art discharge systems affecting efficiency, yield, cost, complexity, etc.

Also contemplated in practicing the invention in its various embodiments are unique means for mounting electrodes of insulating material, wherein O-rings are seated in grooves formed in metallic structures wherever sealing abutment with the insulating electrode is desired, to simultaneously mount, center and vacuum seal the electrode assemblies. In addition, novel cooling, assembling and electrical contacting structural configurations are provided for various of the electrode structures. Means are further provided, in accordance with the invention, for protecting various structural elements in the glow discharge system from undesired exposure to the plasma and avoiding consequent deterioration, and preventing conductive plating of insulators which separate conductive electrodes, due to undesired deposition of target material.

In addition, novel cage and shielding configurations are disclosed for the entire glow discharge system to prevent undesired r.f. radiation leakage to the surrounding environment.

Glow discharge systems, in accordance with the invention, are useful for generating plasma for purposes such as causing cathodic sputtering to etch or clean the cathode material, causing cathodic sputtering for the purpose of applying metallic or dielectric coatings to stationary or moving surfaces placed near or within the generated plasma, and any other application requiring the generation of a plasma or a flux of sputtered material.

Accordingly, it is an object of the present invention to provide a new and improved glow discharge method.

Another object of this invention is to provide a new and improved glow discharge apparatus.

A further object of this invention is to provide a new and improved electrode type glow discharge apparatus.

A further object of this invention is to provide a new and improved method for generating a confined plasma.

Another object of this invention is to provide a new and improved apparatus for generating a confined plasma.

Still another object of this invention is to provide a new and improved r.f. glow discharge system.

Another object of this invention is to provide new and improved double electrode configurations in a glow discharge system.

A further object of this invention is to provide new and improved glow discharge systems embodying a variety of two electrode structural configurations cooperating with a variety of magnetic field configurations to define traps for completely containing plasma.

Another object of this invention is to provide new and improved glow discharge systems which will operate at low working gas pressures with relatively low voltages.

A further object of this invention is to provide new and improved sputtering apparatus which provide a considerable degree of uncoupling between the properties of the plasma discharge and the sputtering process.

Another object of this invention is to provide double electrode type r.f. sputtering devices in which substrates are not heated significantly by the plasma, but in which the substrates can be heated if such heating is desired.

A still further object of this invention is to provide new and improved glow discharge systems which can be scaled to large sizes.

Another object of this invention is to provide new and improved sputtering systems capable of providing substantially uniform deposition rates over a relatively large surface area.

Still another object of this invention is to provide new and improved sputtering systems in configurations for providing uniform coating around the circumference of wire or rod-like shapes or a relatively uniform coating over the surfaces of more complex shapes.

Another object of this invention is to provide new and improved double electrode type r.f. sputtering systems in which both electrodes are target surfaces.

A further object of this invention is to provide new and improved means for mounting and centering sputtering targets fabricated of electrically insulating material.

An additional object of the present invention is to provide new and improved means for cooling targets in a double electrode glow discharge system.

A still further object of this invention is to provide new and improved means for assembling electrodes in a glow discharge system.

Still another object of the present invention is to provide new and improved means for making electrical contact with various electrode structures in a glow discharge system.

Another object of this invention is to provide new and improved means for protecting structural elements from undesired exposure to plasma.

A further object of this invention is to provide new and improved means for preventing conductive plating of insulators separating electrically conductive electrodes.

Yet another object of this invention is to provide new and improved shielding means to prevent undesired r.f. radiation leakage from an r.f. glow discharge system.

The above and other objects and advantages of this invention will become apparent from the following more detailed description, when taken in conjunction with the accompanying drawings of illustrative embodiments.

DESCRIPTION OF THE DRAWINGS

FIG. 7b is a bottom plan view of the electrodes and magnetic field winding of the apparatus shown in FIG. 7a;

FIG. 8 is a longitudinal sectional view of a glow discharge device, constructed in accordance with the present invention, and utilizing post type electrodes;

FIG. 8a is an enlarged, fragmentary sectional view of the area 8a in FIG. 8, and more clearly illustrates the manner in which the electrodes are connected together and shielding is provided for the insulating members;

FIG. 9 is a longitudinal, sectional view of a glow discharge system, in accordance with the invention, using hollow cathode electrodes of an electrically insulating material;

FIGS. 9a and 9b are enlarged, fragmentary sectional views of the areas 9a and 9b, respectively, in FIG. 9, showing in greater detail some of the mounting structure for the cathode electrodes;

FIG. 10 is a longitudinal, sectional view of a glow discharge system, constructed in accordance with the present invention, using hollow cathode electrodes of an electrically conductive material; and FIG. 10a is an enlarged, fragmentary sectional view of the area 10a in FIG. 10.

DESCRIPTION OF THE PREFERRED EMBODIMENTS

Figure 1:
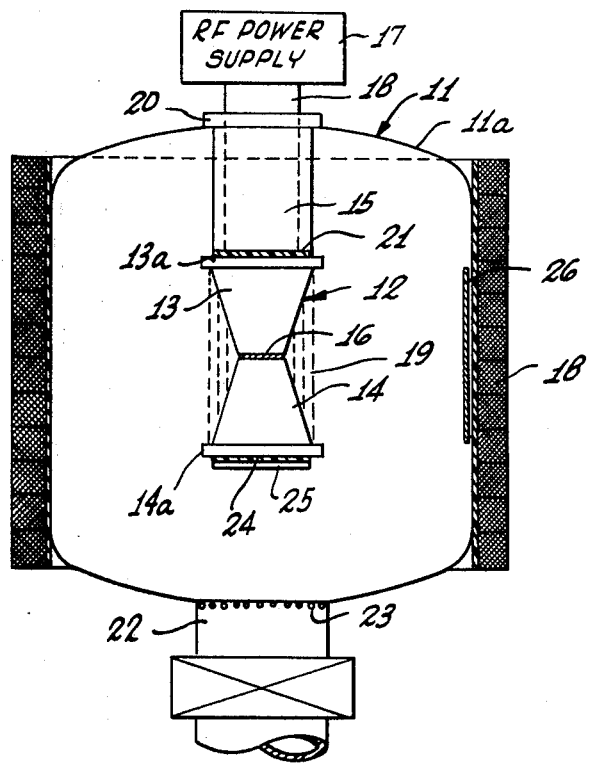
FIG. 1 is a diagrammatic elevational view of a double electrode post type r.f. glow discharge system, in accordance with the invention, suitably mounted in an appropriate vacuum chamber with provisions for magnetic field coils.

Referring now to the drawings, wherein like reference numerals denote like or corresponding parts, and particularly to FIG. 1 thereof, there is shown a glow discharge apparatus constructed in accordance with the present invention and including a conventional vacuum chamber 11 having mounted therein a double electrode type discharge device 12.

FIG. 1 primarily depicts a generalized physical arrangement for post-type double electrode configurations which may take a wide variety of forms and will be discussed in greater detail in connection with FIGS. 2a–2d and 3a–33 of the drawings.

The discharge device 12 includes a pair of "winged" or "flanged", coaxial electrodes 13, 14 mounted within the vacuum chamber 11 and supported by means of a suitable mounting trunk 15. Two electrodes 13 and 14 are physically spaced apart and electrically isolated from each other by means of a suitable insulator 16.

The electrode 13 includes an upper wing 13a, while the electrode 14 includes a lower wing 14a, the wings being used either for mounting purposes or to aid in closing the plasma trap. However, as will subsequently become apparent, the electrodes 13 and 14 may cooperate with the magnetic field in such a manner as to close the trap effectively without the use of the end wings 13a, 14a, in which event the latter wings may be excluded from the structure.

The electrodes 13, 14 together define a cylindrical r.f. post cathode assembly. An r.f. power supply 17, typically operating at a frequency of 1.8 Mc., makes connections through a shielded transmission line 18 extending through the mounting trunk 15 to the electrodes 13, 14.

A plurality of magnetic field coil windings 18 are disposed around and insulated from the outer wall of an electrically conductive housing 11a of the vacuum chamber 11, and these field coils provide a uniform magnetic field in the chamber, with field lines close to and extending between the electrodes 13, 14, as indicated by the magnetic field lines 19, where such a uniform field is desirable. However, some of the post configurations to be subsequently shown will require a magnetic field originating from a field winding within the electrode themselves, and in those cases it may not be necessary to have magnetic fields generated by external field coils such as the coils 18.

The vacuum chamber 11 has a suitable working gas contained within the chamber, such as argon, neon or the like at relatively low pressures, typically at 0.5-1.0 microns.

The mounting trunk 15 and transmission line 18 pass through an appropriate vacuum seal 20 at the top of the chamber 11. A suitable insulator 21 electrically insulates the mounting trunk 15 from the electrode 13 to prevent the mounting trunk from assuming cathode potential and thereby becoming a sputtering target.

The lower end of the vacuum chamber 11 includes a conduit 22 which may be coupled through any suitable valving to a vacuum pump (not shown) in a conventional manner. An electrically conductive screen 23 covers the opening in the electrically conductive housing 11a of the chamber 11 through which the conduit 22 communicates with the chamber. In this regard, the screen 23 and outer conductive housing 11a cooperate to define an r.f. shield which is suitably connected to the center tap ground (not shown) of the r.f. power supply so as to avoid circulating ground currents. In addition, the screen 23 shields the vacuum pump from any discharge that might otherwise go down in the pump.

An end cap consisting essentially of an insulator 24 and shield 25, is located outside the electrode assembly adjacent the wing 14a of the electrode 14, to prevent sputtering from occurring on the end surfaces of the electrode. Such an end cap structure has been previously disclosed in the aforementioned application Ser. No. 178,240.

Appropriate coolant conduits (not shown) are also connected to the discharge device 12 through the mounting trunk 15 for supplying suitable fluid coolants, such as water and the like.

A substrate 26 is shown disposed within the vacuum chamber 11 to allow sputtering of a coating or plating from each of the electrodes 13, 14 which are the cathode targets of the system. The substrate 26 may be positioned in any convenient location between the electrodes 13, 14 and the sidewall of the chamber 11, the substrate being supported in any suitable manner. Port holes (not shown) or other covered openings can be provided in the outer wall of the vacuum chamber 11 to allow access to the interior of the chamber for observation, insertion, positioning and removal of the substrate 26.

Referring now to FIGS. 2a-2d, post type double electrode structures are shown in various embodiments, each of which includes a conical electrode 13 coaxial with a conical electrode 14, with their frustum ends adjacent to one another and separated only by the insulator 16, for electrical isolation purposes, all as substantially shown in FIG. 1. However, each of FIGS. 2a-2d shows a different magnetic field configuration so that the plasma traps are defined differently in each case.

As previously indicated, the end wings 13a, 14a shown associated with the electrodes 13, 14 may be included for mounting purposes or to aid in defining the plasma trap. If they are not needed for either of these purposes, the end winds need not be included. The inclusion of these end wings, however, enables the angle of the conical surfaces defining the electrodes 13, 14 to be selectively tailored so that the sputtered material is ejected in selected directions.

Where the end wings 13a, 14a are used to aid in defining the boundaries of the plasma trap, they are made large enough to effectively close the trap or the magnetic field strength would have to be increased unduly. In this connection, wing size is directly related to the space required for the primary electrons to lose their useful energy in making additional ions.

Figure 2A:
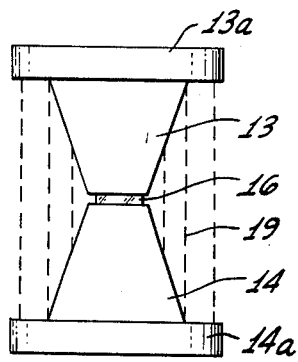
FIGS. 2a through 2d illustrate embodiments of post type double electrode structures with a variety of differing magnetic field configurations which may be used in practicing the invention.

In FIG. 2a, the magnetic field lines 19 run parallel to the axis of symmetry of the conical electrodes 13, 14 so that they intercept one of the electrodes 13, 14 on each side and, hence, define a single plasma trap utilizing both of the electrodes 13, 14 acting in concert. Whether or not the wings 13a and 14a aid in defining the trap depends upon the strength of the magnetic field and the radial distance from the axis of symmetry required to completely contain substantially all of the primary electrons capable of doing additional ionization work. The magnetic field shown in FIG. 2a is typically generated by magnetic field coils, such as the coils 18 in FIG. 1, wound about the outside of the vacuum chamber.

Figure 2B:
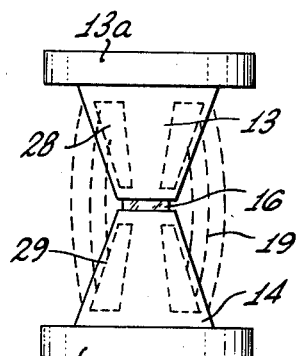

FIG. 2b shows a similar electrode configuration as FIG. 2a, but with two sets of magnetic field coils 28, 29 provided inside the electrodes 13, 14, respectively, and generating a curved magnetic field terminating on each of the electrodes. Hence, the embodiment of FIG. 2b also defines a single plasma trap with the electrodes 13, 14 acting in concert to close the trap.

In FIG. 2c, we again have a pair of field coils 30, 31, with one field coil being inside each of the electrodes 13, 14. However, in the embodiment of FIG. 2c, the magnetic field generated by each field coil begins and terminates on the same electrode, so that two separate plasma traps are defined. Each plasma trap is defined by the magnetic field 19 and only one electrode, although some small electron current exists between the two traps for electrical circuit continuity.

Figure 2C:
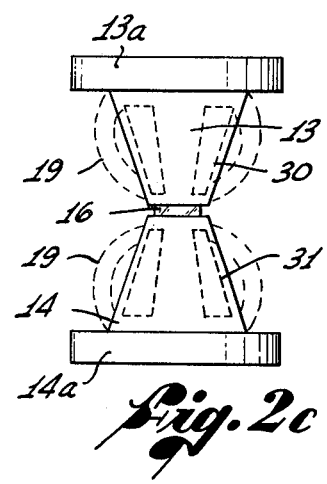
Figure 2D:
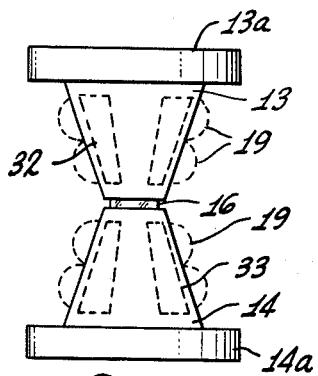

FIG. 2d is similar to the embodiment shown in FIG. 2c, utilizing two field coils 32, 33 within the electrodes 13, 14, respectively. However, in the embodiment of FIG. 2d, a scalloped magnetic field is defined which provides a plurality of separate plasma traps in connection with each individual electrode.

Although not specifically shown in the drawings, hybrid magnetic trapping configurations are feasible and may be provided by a combination of field shapes such as the magnetic field shown in FIG. 2b with that shown in either FIG. 2c or FIG. 2d. Such hybrid configurations would provide a plurality of traps defined by individual electrodes and the magnetic field, together with an additional plasma trap defined by the magnetic field and both of the electrodes acting in concert.

It will also be appreciated that, while the magnetic field in the embodiments of FIGS. 2b-2d has been described as generated by internal magnetic field coils, such magnetic fields could also be generated using permanent magnets.

FIGS. 3a–3e illustrate various double electrode post configurations which are suitable for use with any of the magnetic field configurations shown in FIGS. 2a–2d to define plasma traps in a glow discharge system following the teachings of the present invention.

Figure 3A:
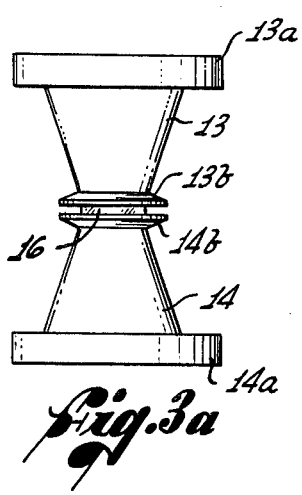
FIGS. 3a through 3e illustrate several embodiments of double electrode structural configurations which may be used in the practice of the present invention.

FIG. 3a shows a pair of coaxial conical electrodes 13, 14 which include inside wings 13b, 14b, as well as outer end wings 13a, 14a, respectively. The angles of the inside flanges 13b, 14b with respect to the cone faces is not critical. Making the inner wings shorter than the outer wings facilitates use in the hybrid magnetic field mode previously discussed.

Figure 3B:
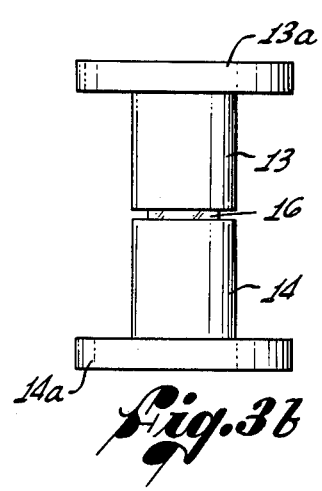
Figure 3C:
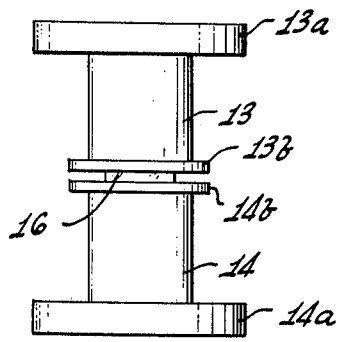

FIG. 3b illustrates a pair of straight cylindrical coaxial electrodes 13, 14 with no inner wings, while FIG. 3c illustrates the same configuration including inner wings 13b, 14b for each of the electrodes 13, 14, respectively. Again, the size of the inner wings determines how readily the electrode configuration can be operated in a hybrid mode wherein traps are defined by the magnetic field and each electrode separately, as well as with both of the electrodes acting in concert.

Figure 3D:
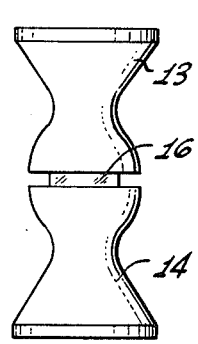

FIG. 3d shows a pair of coaxial electrodes 13, 14 with a complex curve for the outer electrode surface, but still having axial symmetry. The electrode surface is shaped in accordance with a desired geometric configuration for the sputtering pattern from the electrodes. The electrodes 13, 14 may include outer or inner wings depending upon the desired sputtering geometry.

Figure 3E:
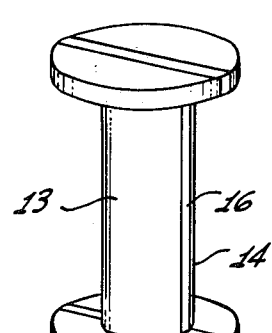

In the embodiment of FIG. 3e, a pair of electrodes 13, 14, in the form of a pair of split cylinders, are separated by an insulator 16. While the double electrode configuration of FIG. 3e is preferably used with a straight magnetic field, such as that shown in FIG. 2a, any of the magnetic field configurations previously discussed may be used with this electrode configuration, the axial symmetry being imposed by the magnetic field as opposed to the electrodes.

In all of the glow discharge electrode and magnetic field configurations disclosed in accordance with the invention, the plasma traps are characterized by axial symmetry about an axis of rotation, the symmetry being imposed by the magnetic field, the electrodes or both the magnetic field and the electrodes.

Figure 4:
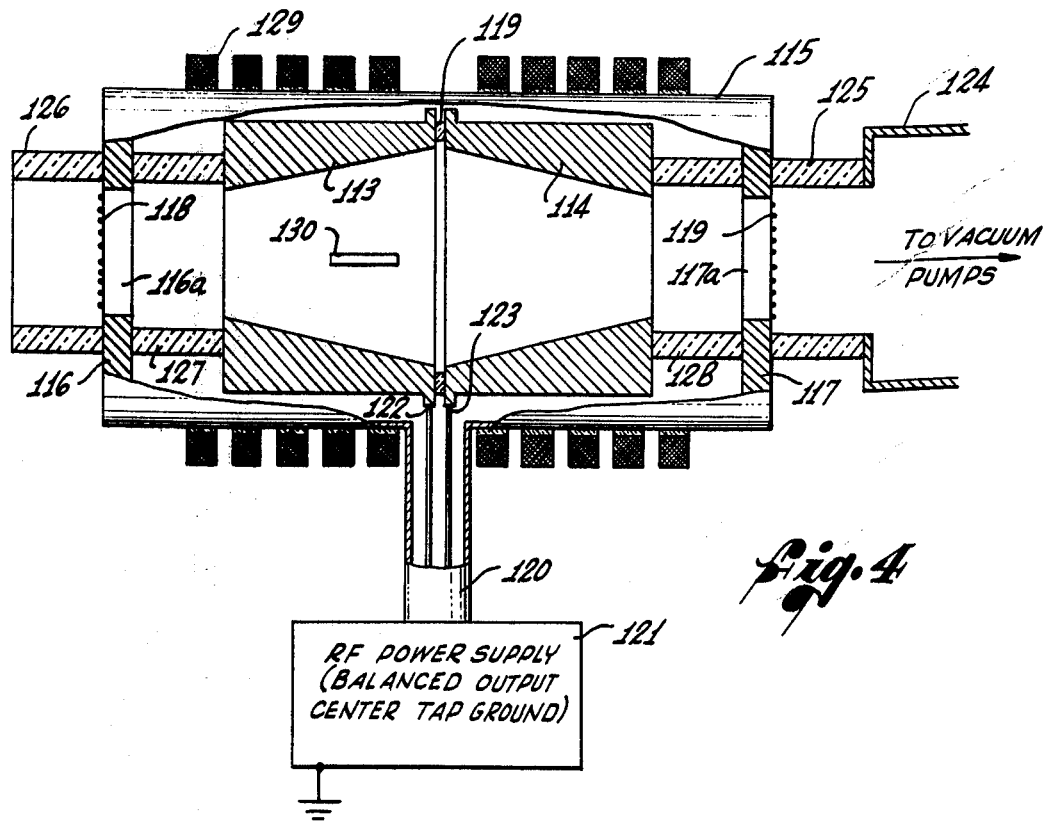
FIG. 4 is a diagrammatic elevational view, similar to FIG. 1, but illustrating the case where hollow cathode assemblies are utilized.

Referring now to FIG. 4, there is shown a diagrammatic view similar to FIG. 1, but illustrating the case where hollow electrode assemblies are utilized to generate an internal plasma. A pair of hollow, conical, coaxial electrodes 113, 114 are appropriately supported within an outer electrically conductive cylindrical housing 115. The housing 115 is terminated at both ends by end shields 116, 117 having ports 116a, 117a, respectively, through which a vacuum may be pumped. The ports 116a, 117a are covered by electrically conductive screens 118, 119. The electrodes 113, 114 are separated by a suitable electrical insulator 119, and r.f. power is delivered via a shielded transmission line 120 from a suitable power supply 121 to each of the electrodes 113, 114 at electrical connection points 122, 123, respectively.

The grounded power supply 121, shielded transmission line 120, cylindrical housing 115, end shields 116, 117 and screens 118, 119 together constitute a Faraday type r.f. shield similar to that provided by the vacuum chamber and screens in the embodiment of FIG. 1.

Communication with the vacuum pumps is made via any appropriate conduit 124 and, preferably, the conduit 124 is separately grounded and isolated from the end shield 117 by an insulating member 125. A similar insulating member 126 is located on the opposite side of the system for connection to an end cap, another stage of glow discharge apparatus, or a feeding station for a suitable substrate, such as the wire or rod-like substrate 130 along the central axis of the electrodes 113, 114.

An electrical insulator 127 extends between the electrode 113 and the end plate 116, and a like electrical insulator 128 extends between the electrode 114 and the end plate 117, to isolate the electrodes from the electrically conductive r.f. shield.

A plurality of magnetic field coils 129, similar to the field coils 18 in FIG. 1, are wound about the exterior of the cylindrical housing 115 to provide the plasma confining magnetic field configuration which cooperates with the electrodes 113, 114. In this regard, where hollow cathode systems are used, the magnetic field configurations are always supplied by external field coils.

Figure 5A:
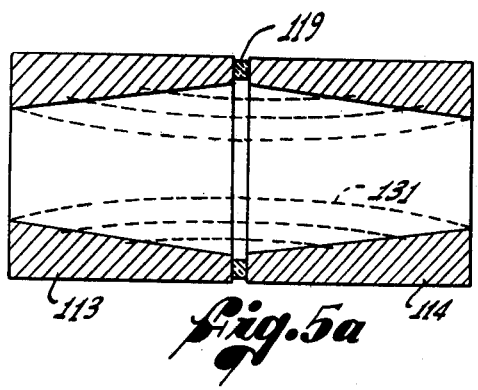
FIGS. 5a through 5c illustrate hollow cathode structures with various magnetic field configurations which may be used in accordance with the invention.
Figure 5B:
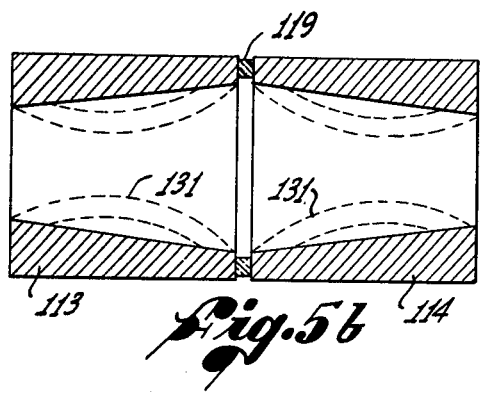
Figure 5C:
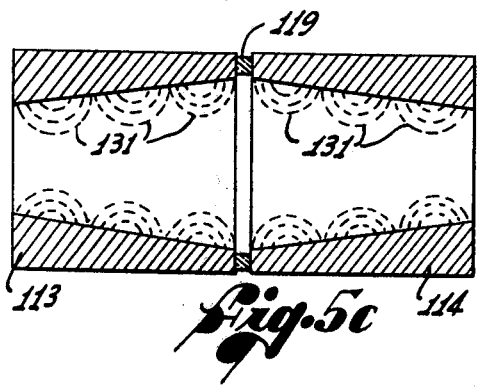

FIGS. 5a–5c illustrate various magnetic field configurations which may be used with hollow cathode electrode configurations. It will be appreciated that, while conical electrode assemblies are shown in all of in the embodiments of FIGS. 5a–5c, this is by way of example only, and other hollow electrode configurations may be used with the magnetic field configurations shown. In addition, while an insulator 119 is shown separating the electrodes 113, 114, the latter insulator may be excluded if the electrodes themselves are of an electrically insulating material, as where the target material being sputtered is a dielectric.

In FIG. 5a, all of the magnetic field lines 131 traverse from the electrode 113 to the electrode 114, so that a plasma trap is defined by the magnetic field and both of the electrodes acting in concert. Hence, FIG. 5a illustrates the hollow electrode counterpart of the post configurations shown in FIGS. 2a and 2b.

FIG. 5b illustrates the case where the magnetic field lines exit and enter at two locations on the same electrode, so that separate plasma traps are defined by the magnetic field and each individual electrode. FIG. 5b thus is the hollow electrode counterpart of the configuration shown in FIG. 2c for post type electrodes.

Similarly, FIG. 5c illustrates a scalloped magnetic field configuration wherein a plurality of separate traps is defined by the magnetic field and each of the electrodes. Thus, FIG. 5c is analogous to the magnetic field configuration previously discussed in connection with FIG. 2d, FIG. 5c dealing with the hollow electrode case.

FIGS. 6a–6e illustrate various embodiments of double electrode hollow cathode configurations which may be used with any of the magnetic field configurations shown in FIGS. 5a–5c, including the hybrid situation wherein the magnetic field shown in FIG. 5a may be used in combination with the magnetic field configurations shown in FIG. 5b or 5c.

Figure 6A:
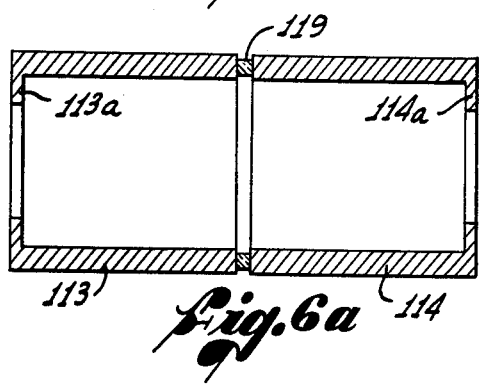
FIGS. 6a through 6e illustrate several embodiments of hollow cathode electrode structures which may be used in practicing the present invention.

FIG. 6a shows a pair of hollow, coaxial cylindrical electrodes 113, 114, separated by an electrical insulator 119 if needed. If the magnetic field configuration of FIG. 5a is used, either alone or together with the magnetic field configurations of FIGS. 5b and 5c, it is desirable to include outer end wings 113a, 114a for the electrodes 113, 114, respectively in order to close the plasma trap. Otherwise, the end wings need not be included where the magnetic field combines with each electrode separately to define plasma traps.

Figure 6B:
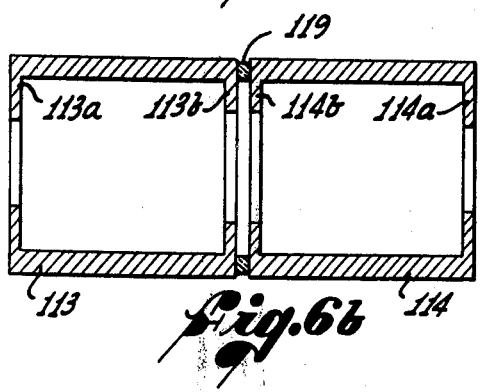

FIG. 6b is similar to FIG. 6a, but with the addition of internal end wings 113b, 114b to the electrodes 113, 114, respectively, the inner wings being shorter than the outer end wings 113a, 114a, to enable hybrid plasma trap operation if desired.

Figure 6C:
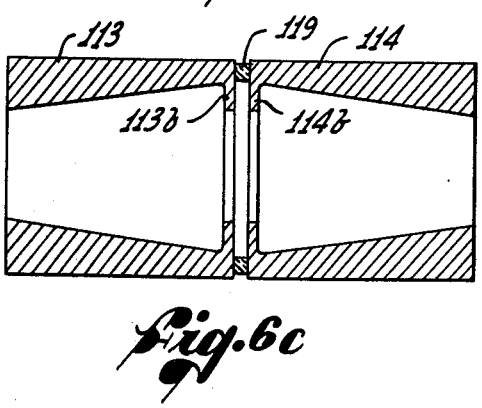

FIG. 6c illustrates a pair of coaxial, conical electrodes 113, 114 with inner end wings 113b, 114b, respectively, the latter configuration being capable of utilizing any of the previously discussed magnetic field configurations for hollow cathode electrodes.

Figure 6D:
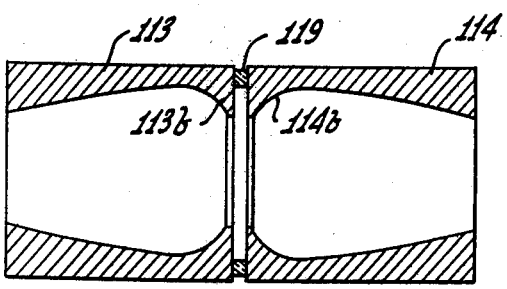

FIG. 6d is similar to FIG. 6c but with a generalized, complex shape for the inner cylindrical surface of the electrodes 113, 114, so that the geometry of the sputtering pattern can be varied to meet any requirements.

Figure 6E:
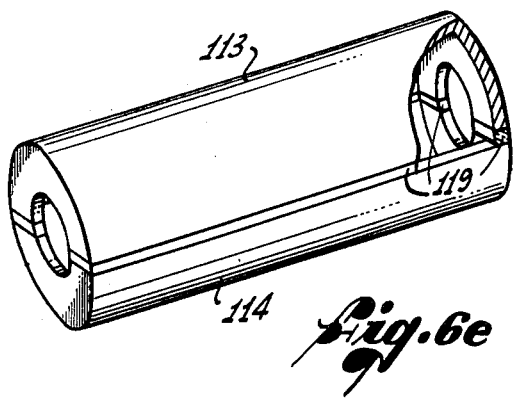

FIG. 6e illustrates a pair of hollow cathode electrodes comprising a cylinder split along its longitudinal axis and having an insulator 119 between the two half cylinders if the electrodes are of an electrically conducting material. Again, the electrode configuration of FIG. 6e may be used with any of the previously discussed magnetic field configurations, the axis of symmetry of the resulting plasma trap configurations being determined by the magnetic field rather than by any symmetry of the electrode structure.

Having described various types of double electrode configurations, of the post type and the hollow electrode type, in combination with various magnetic field configurations, to define a wide variety of differently configured traps for the containment of plasma in a glow discharge system, a discussion of the manner in which these traps function is now presented.

In all of the two electrode r.f. glow discharge devices described in connection with the present invention, both electrodes are sputtering targets. The glow discharge device is operated at a combination of pressure and frequency such that essentially all of the energy transferred between the r.f. electric field and the charged plasma particles occurs in the electrode cathode sheath region. The operation of such an r.f. discharge apparatus is analogous to that of a d.c. discharge device with each electrode behaving as a d.c. cathode throughout the major portion of the r.f. voltage cycle. An average potential drop approximately equal to the zero to peak applied r.f. potential, less the voltage drop across the dielectric sputtering targets, exists in the cathode sheath over each of the target electrodes. Ions of the working gas drift from the plasma volume into the cathode sheath where they fall through the sheath potential as they are accelerated in the direction of the cathode target surface. As these bombarding ions impact on the cathode surface, they sputter atoms of the target material and also cause secondary electrons to be released from the cathode surface. These electrons are accelerated in the cathode sheath to essentially the entire sheath potential, where they enter the plasma volume as primary electrons and produce new ions by electron-atom collisional processes. A fraction of the ions produced in the plasma volume by these primary electrons, and their secondaries, eventually make their way to the edge of the cathode sheath, where they enter the sheath, bombard the cathode target surface, and so repeat the process. In this way, the cathode processes permit the discharge to sustain itself.

In such a d.c. or r.f. glow discharge device, the operating voltage may be considered as an index of the discharge efficiency. Where electrically insulating targets are used, in the r.f. case, the operating voltage referred to is the zero to peak operating voltage across the glow discharge, as opposed to the total voltage across the discharge device which would include the voltage drop across the dielectric sputtering targets.

The combination of electrode pairs and a suitably shaped magnetic field in a system having axially symmetry is used to provide a trap for the primary electrons which restricts their motions both radially and axially, thereby causing them to remain near the target surfaces until a large fraction of their energy has been expended in ionizing collisions. Thus, the ions are produced adjacent the target surface, i.e., the plasma created by the trapped electrons essentially defines an annulus about an axis or rotation which surrounds, and is in intimate contact with, the electrodes constituting the targets.

The plasma trap is achieved by a combination of electron reflections from surfaces at cathode potential and electron deflections by the magnetic field. The closed plasma trap is thus formed on some sides by the magnetic field and on the remaining sides by the cathode surfaces, so that end losses are completely precluded.

In referring to the closure of the plasma trap on all sides it will be appreciated that a real rectangular volume in the plasma has six sides, wherein two of the sides of the trap are closed by axial symmetry, so that only four sided cross-sectional configurations viewed perpendicular to the axis of symmetry need be considered.

In the r.f. double electrode configuration, the pair of electrodes are driven by two r.f. feed lines. Since the electrode pair is driven by alternating voltage, the electrodes are alternately anode and cathode with respect to each other. Referring to the two electrodes as A and B, respectively, electrode A is at times a cathode with respect to electrode B and at other times an anode with respect to electrode B. In general, both electrodes are biased negatively with respect to the plasma throughout a major portion of the r.f. cycle, i.e., electrodes A and B both behave as cathodes with respect to the plasma. For only very brief periods of time, on alternate half cycles of the r.f. potential, electrodes A and B become anodes with respect to the plasma.

With the foregoing description in mind, r.f. plasma traps can be divided into two categories. In the first category, the two electrodes A and B operate in concert to provide a partial closure of the trap, with the magnetic field completing trap closure. In such a case, magnetic field lines eminate from electrode A and enter electrode B. In this instance, there is relatively free electron motion along the field lines from electrode A to electrode B while the cathode sheath at the two electrodes forms reflecting surfaces for electron motion. Hence, taking a cross-section through the system on a plane containing the axis of symmetry, two sides of the plasma trap are closed by the magnetic field lines, another side is closed by electrode A, and the last side is closed by electrode B.

In a second case, the electrodes A and B do not operate in concert, but rather completely independent of each other, and in this case the magnetic field is used to complete separated traps, one trap adjacent electrode A and the second trap adjacent electrode B. An example is where the magnetic field lines originate from electrode A, bend and then re-enter electrode A. Again, taking a cross-sectional view on a plane containing the axis of symmetry, a trap is formed adjacent to electrode A wherein one side of the plasma trap is closed by the cathode sheath at electrode A and the remaining three sides of the trap are closed by the magnetic field at electrode A. A similar separate trap is found at electrode B and is formed by the cathode sheath at electrode B and the magnetic field.

In a third case, which is the hybrid situation, suitable manipulation of currents in the magnetic field producing coils can provide magnetic field lines wherein some of the field lines pass from electrode A to electrode B while other field lines eminate from electrode A and return to electrode A, the situation being duplicated at electrode B, so that both types of plasma traps, separate and bridging between electrodes, exist simultaneously.

As previously indicated, the pair of electrodes in an r.f. system alternate as cathode and anode with respect to each other, whereas both electrodes are generally negatively biased with respect to the plasma throughout most of the r.f. cycle. For the case where the magnetic field is so arranged that the two electrodes A and B previously referred to operate in concert with each other, to define a single plasma trap, the manner in which the trap functions to maintain the desired plasma density is now described.

For illustrative purposes, consider an instant of time at which electrode A is a cathode with respect to electrode B. Since both electrodes are cathodes with respect to the plasma, both will receive ion bombardment which causes the release of electrons from these electrodes in a manner governed by a secondary emission coefficient $\gamma_i$. The electrons emitted by electrode B will be accelerated by the cathode sheath around electrode B and will move away from the latter electrode generally along the magnetic field lines. Accordingly, since the magnetic field lines extend from electrode B to electrode A in the postulated configuration, these emitted electrons will move to electrode A. However, since electrode A is a cathode with respect to electrode B, the electrons will be reflected by the cathode sheath at electrode A and will return to electrode B where they are again reflected by cathode sheath at electrode B. The net result is that the electrons emitted by electrode B are trapped by electrode A and electrode B.

Now consider electrons emitted by electrode A, as opposed to the previous situation for electrons emitted from electrode B, electrode A having been indicated as being at a more negative potential than electrode B, i.e., electrode A is a cathode with respect to electrode B. These electrons will be accelerated by the cathode sheath around electrode A and will move away from electrode A along the magnetic field lines to ultimately arrive at electrode B. Since the gas pressure in the discharge system is low, these latter electrons will have lost little or no energy when they arrive in the vicinity of electrode B and they will have enough energy to penetrate the cathode sheath at electrode B so that they actually crash into electrode B. This results in removal of electrons from the trap. However, secondary electrons may be emitted from electrode B as a result of the crash. This emission due to electron bombardment, as opposed to bombardment by gas ions, is governed by a secondary emission coefficient $\gamma_e$.

In light of the foregoing explanation, it will be apparent that the electron emission from electrode B is augmented by the removal from the trap of electrons which originally were emitted at electrode A. Hence, while the electrons from electrode A are trapped for only a very short period of time, these electrons give rise to enhanced electron emission from electrode B, and the latter electron emission is effectively trapped. It will be apparent, therefore, that the plasma density of an r.f. device wherein both electrodes are operating in concert to define a plasma trap, is determined by two secondary emission coefficients, namely $\gamma_i$ and $\gamma_e$.

By similar analysis, it can be shown that, if the magnetic field is shaped so that the two r.f. electrodes do not operate in concert, but rather define separate traps with the magnetic field, then the plasma density is determined primarily by only the single coefficient $\gamma_i$, secondary emission being induced primarily by ion bombardment with minimal contribution due to electron bombardment.

Referring now more particularly to FIGS. 7a through FIGS. 7d of the drawings, there are shown two embodiments of r.f. glow discharge systems utilizing pairs of planar electrodes 213, 214 to maintain the discharge and cooperate with the magnetic field to define plasma containing traps. The primary distinction between the embodiment shown in FIGS. 7a and 7b, and the embodiment shown in FIGS. 7c and 7d, resides in the electrode shape and the type of plasma traps defined.

Figure 7A:
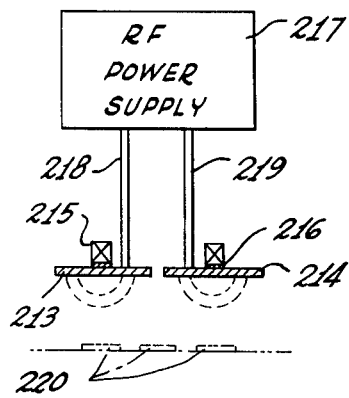
FIG. 7a illustrates one embodiment of a glow discharge apparatus, in accordance with the invention, using double planar electrodes.
Figure 7B:
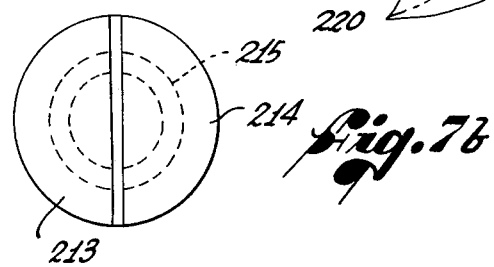

FIGS. 7a and 7b show the electrodes 213, 214 as being semicircular or D-shaped electrodes which together define a circle split along a diameter. In FIGS. 7a and 7b, a toroidal coil 215, having its axis of rotation perpendicular to the plane of the electrodes 213, 214, and located on the opposite side of the electrodes from the target surfaces facing a plurality of substrates 220, defines a toroidal magnetic field which cooperates with each of the electrodes to define a hybrid plasma containing trap. The magnetic coil 215 is separated from the electrodes 213, 214 by an appropriate electrical insulator 216. Electrical power is supplied to each of the electrodes 213, 214 by a suitable r.f. power supply 217, over shielded buses 218, 219, respectively.

Figure 7C:
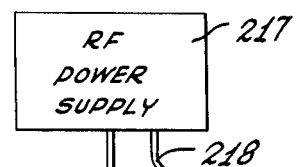
FIG. 7c shows another embodiment of a double planar electrode glow discharge apparatus in accordance with the invention.
Figure 7D:
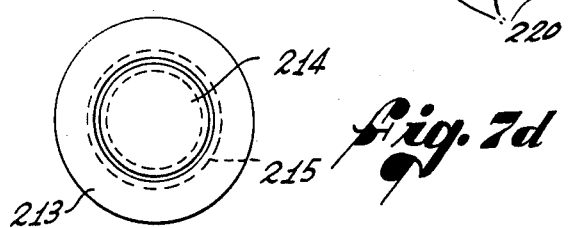
FIG. 7d is a bottom plan view of the electrodes and magnetic field winding of the apparatus shown in FIG. 7c.

As previously indicated, the primary difference in the embodiment of the invention as shown in FIGS. 7c and 7d from that shown in FIGS. 7a and 7b resides in the shape of the electrodes 213, 214. In FIGS. 7c and 7d, the electrodes 213, 214 are in the form of concentric discs spaced from each other, electrode 213 constituting an outer ring electrode with the electrode 214 constituting an inner solid circular disc. In addition, the toroidal magnetic coil winding 215 defines a magnetic field in FIGS. 7c wherein both electrodes 213, 214 act in concert with each other and the magnetic field to define a plasma trap.

The axis of symmetry for the plasma traps in the embodiment shown in FIG. 7a through 7d is the axis of revolution for the toroidal magnetic field.

In addition, while circular, planar configurations have been shown for the electrodes in the embodiments of FIGS. 7a–7b, the electrodes could be curved, sheet-like electrodes rather than planar electrodes, and could be in shapes other than circular.

Glow discharge systems of the general type disclosed in FIGS. 7a through 7d of the drawings may be mounted in any appropriate closed chamber environment such as that shown in FIG. 1 for post type electrode assemblies, and with appropriate trunks like the trunk 15.

FIGS. 8, 9 and 10 of the drawings show several, more detailed embodiments of double electrode glow discharge systems, in accordance with the invention, in specific mounting chamber configurations.

Referring now to FIGS. 8 and 8a, there is shown a conventional vacuum chamber 300 fabricated from a non-magnetic material, such as stainless steel or aluminum, and provided with a port 301 through which an appropriate substrate 302 may be admitted for purposes of sputter coating. A post tube, cylindrical, double electrode discharge device 303, constructed in accordance with the present invention, is mounted within the chamber 300. A pair of magnetic field coils 304, 305, is positioned around the outside of the vacuum chamber, in essentially a Helmholtz configuration, the common axis of the pair of coils being coincident with the cylindrical axis of the vacuum chamber and the discharge device 303. The coils 304, 305 provide a substantially uniform magnetic field in the central region of the vacuum chamber 300.

The discharge device 303 includes a pair of coaxial, conical electrodes 306, 307 having confronting frustum faces 306a, 307a, respectively, and end wings or flanges 306b, 307b at the cone bases remote from each other.

As best observed in FIG. 8a, the electrodes 306, 307 are separated by an insulating ring 308, of glass, pyrex, ceramic, quartz or other suitable material, so that the frustum face 306a and 307a do not contact each other. This is particularly significant where the electrodes are fabricated of an electrically conductive material.

Electrodes 306, 307 are typically fabricated from the metal to be sputtered or, from an easy to machine metal such as aluminum or the like, with a thick coating (not shown) of the metal or ceramic to be sputtered. Such thick coatings can, for example, be applied with adequate adhesion by wall known techniques of plasma spraying.

R.F. electrical power is delivered from a suitable power supply (not shown) to the electrodes 305, 307 by a coaxial transmission line 309 having a central conductor 309a and an outer conductor 309b, the central conductor being physically and electrically connected to the electrode 306 and the outer conductor being connected to the electrode 307. In this regard, the central conductor 309a passes through a clearance aperture 307c in the frustum face 307a of electrode 307, and into threaded engagement with the frustum end 306a of the electrode 306 via an internally threaded boss 306c formed in the latter electrode.

The two electrodes 306, 307 are cooled by any appropriate fluid coolant, such as water, flowing in a cooling chamber 311 formed in the interior of electrode 306 and by a cooling chamber 312 similarly formed in electrode 307. The coolant is delivered to the cooling chamber 311 by means of a hollow conduit 313 which, together with a mounting flange 314 secured to the end wing 306b of the electrode 306, also serves as a mechanical support for the discharge device 303. A similar conduit 315 and its associated mounting flange 316 provide a path for coolant to the chamber 312 in the electrode 307 and also provide a mechanical support for the end of the discharge device 303 opposite that supported by the conduit 313.

Coolant flow passes in and out of the conduit 313 and chamber 311 through conventional fittings 317, 318 and, likewise, in and out of conduit 315 and chamber 312 via appropriate fittings 319, 320. Internal conduits 322 and 323 carry the entering coolant directly from the fittings 317, 319, respectively, to the areas of the respective electrodes which are subject to the greatest heating.

An insulating coating (not shown) on the outer surfaces of the conduits 313, 315, in combination with the magnetic field and a pair of outer concentric floating shields 325, 326, respectively, prevent the plasma discharge from forming over the coolant conduits and causing sputtering from the conduits.

The shields 325, 326 are in the form of cylindrical sleeves extending from ground shield support plates 327, 328, respectively, one plate at each end of the vacuum chamber 300. The electrode and coolant conduit assemblies are electrically insulated from the floating shield supports 327, 328 by suitable insulator rings 329, 330, respectively. Similarly, the floating shield supports 327, 328 are insulated from the vacuum chamber 300 by a pair of insulator rings 331, 332, respectively.

The discharge device 303 is held together by the central conductor 309a which also serves as a compressioning member, both ends of the central conductor being threaded. The conductor 309a is typically fabricated from a high strength material such as stainless steel with a copper coating having a thickness equal to several times the skin depth for the operating frequency (typically in the range of 1 mc to 10 mc).

As previously indicated, one end of the central conductor 309a engages the boss 306c of the electrodes 306. A nut 333 threads onto the opposite end of the conductor 309a, thereby transmitting a compressive force through an insulator ring 334 fabricated from a ceramic or high strength plastic material, and onto the outer conductor 309b, thereby placing the central conductor in tension. This latter tension causes a pair of O-rings 335, 336, seated in grooves in the frustum faces 306a and 307a, respectively, and in abuttment with opposite sides of the insulator ring 308, to be compressed about the center insulator so as to form a vacuum seal.

Additional O-ring seals 337, 338, the seal 337 being located between the electrode wing 306b and the conduit flange 314, with the seal 338 being located between the electrode wing 307b and the conduit flange 316, vacuum seal these abutting surfaces. Additional O-rings 339 through 347 on opposite sides of the insulator rings 329, 330, 331, 332, and at the junction between the conduit 315 and the end mounting plate 348 for the fittings 319, 320, complete the vacuum seal in the system.

In addition, an O-ring 349, trapped between the outer conductor 309b and the inside face defining the coolant chamber 312 of the electrode 307, and another O-ring 350 between the outer conductor and the central bore of the end plate 348, provide water seals and permit the coaxial transmission line 309 to be maintained in air at atmospheric pressures so as to minimize the problem of electrical breakdown and arcing.

A conventional, sliding vacuum seal 351, seals off the coolant chamber 311 and its associated exit and entry channels to provide the flexibility required when adjustments are made in the tension applied to the central conductor 309b.

As best observed in FIG. 8a, a pair of overlapping and spaced apart baffle lips 352, 353, in the form of concentric cylinders with overlapping ends, extend from the frustum faces 306a, 307a of the electrodes 306, 307, respectively, outside the insulator ring 308, so that the ring is effectively surrounded by the lips. In this way, the insulator ring 308 is shielded from the plasma and metallic sputtered material, thus preventing an electrically conductive coating from being formed over the surface of the insulator ring which would cause the two electrodes to become electrically short-circuited together.

The substrates 302 are conveniently located around the inside wall of the vacuum chamber 300, in the path of sputtered material from the target electrodes 306, 307.

In operation, the conical electrode surfaces in FIG. 8 intersect magnetic field lines to form the plasma trap shown as a shaded region in FIG. 8. Electrons formed by ion bombardment and the like on the conical electrode surfaces are accelerated in the sheaths surrounding the electrodes and enter the plasma trap carrying the energy they gained in the sheaths. Within the trap, these electrons move freely along the magnetic field lines, but can only cross the field lines via collisional assisted diffusion. The electrons move back and forth along the magnetic field lines, reflecting first off one electrode and then the other, while using their energy to make ions by collisions with the working gas atoms in their paths. These electrons will continue this motion until they happen to be incident on one of the electrodes at a time in its r.f. electrical cycle when it is serving as an anode, or they diffuse regularly out of the trap via collisional processes. In this latter regard, the radial trap depth is made large enough so that the average electron has given up all of its useful energy by the time it has diffused across the depth of the trap, i.e., it leaves the trap with an energy less than the first ionization potential for the working gas in question (e.g., 15.75 ev for argon).

The floating shields, 325, 326 are loss surfaces for those few electrons or ions which should happen to escape the trap. Charged particles losses on these surfaces discourage the formation of plasma over the surfaces of the coolant conduits 313, 315, which are at the r.f. potential of the target electrode surfaces.

Referring now more particularly to FIGS. 9, 9a and 9b of the drawing, an embodiment of the invention is illustrated utilizing a hollow cathode discharge device 400 for coating rod and wire-like shapes, or the convex surfaces of more complete articles, with an electrically insulating coating. The discharge device 400 consists primarily of two coaxial, hollow conical electrodes 401, 402 which are mounted with their bases facing one another in a substantially uniform magnetic field formed by a pluraity of magnetic field coils 403 which surround the overall assembly and are appropriately insulated therefrom.

A pair of conical electrode surfaces 401a, 402a are thus arranged so that the magnetic field lines from the coils 403 cut the electrode surfaces in such a way as to form an annular, plasma containing trap. As in previously discussed configurations, the trap causes large numbers of ions of the working gas to be formed in the vicinity of the target electrode surfaces, thereby contributing to enhanced efficiency of the sputtering process.

The conical electrodes 401, 402 consists essentially of ceramic conical sections which are formed from the insulating material to be sputtered. The conical electrodes 401, 402 are surrounded and captured by outer cylindrical fluid coolant jackets 404, 405, respectively.

The manner in which the overall assembly is held together is next described. As best observed in FIG. 9a, a pair of cooling jacket flanges 406, 407, one at each of the confronting ends of the jackets 404, 405, respectively, enable the jackets to be bolted together by a plurality of electrically insulating bolts 408, of nylon or the like. The electrodes 401, 402 and jackets 404, 405 are held apart by a spacer ring 409, of aluminum or other easily machined material, formed with suitable O-ring grooves 410, 411 on opposite faces of the ring. The latter spacer ring 409 is captured between confronting polished, outwardly extending flanges 412, 413 of the electrodes 401, 402, respectively, hence providing, with O-rings seated in the appropriate grooves, a vacuum seal. The purpose of the spacer ring 409 is to provide the O-ring grooves 410, 411 so that such grooves do not have to be machined into the ceramic conical sections defining the electrodes. Similarly, O-ring grooves 414, 415 are machined in the cooling jackets 404, 405, respectively and are located opposite a polished face on the side of the conical section flanges 412, 413 opposite that in contact with the ring 409, thus capturing suitable O-rings therebetween and forming a water seal.

Another water seal is formed by a pair of electrode retainer rings 416, 417 which bolt onto the opposite remote ends of the cooling jackets 404, 405, respectively. As best observed in FIG. 9 and 9b, the inner face of each retaining ring is chamfered to define a portion of a triangular O-ring groove, the groove 419 being partially provided by the retainer ring 417, with the corresponding groove 418 being partially provided by the retainer ring 416. The complete triangular sealing grooves 418, 419 are defined by the chamfered faces of the retaining rings 416, 417 as they abut inwardly directed cooling jacket flanges 404a, 406a, respectively.

As best observed in FIGS. 9 and 9b, in addition to providing a water seal, the O-ring grooves 418, 419 and their associated O-rings assist in centering the ceramic conical sections which define the electrodes 401, 402 within the water jackets 404, 405, respectively.

Suitable coolant conduits 420, 421 circulate coolant into and out of the cooling jacket 404. These conduits, and similar coolant conduits 422, 423 for the cooling jacket 405, may be fabricated of plastic pipe or the like.

The two electrode assembly is driven by a balanced r.f. input with a center ground. A pair of r.f power lines 424, 425 are appropriately connected to the cooling jacket flanges 406, 407, respectively.

A pair of electrically conductive screens 428a, 428b, of stainless steel or the like, are provided in the form of perforated sheets installed on the inside of the water jackets 404, 405, respectively, adjacent to, but spaced from, the ceramic conical sections defining electrodes 401, 402. These screens 428a, 428b cause a uniform r.f. potential to be applied to the outer surface of the ceramic electrodes 401, 402 and thus promote the occurrence of uniform sputtering over the inner target surfaces of these electrodes. The spaces between the screens 428a, 428b and their respective electrodes 401, 402 serves to improve cooling efficiency and minimize hot spots.

The electrode assembly is capped at each end with electrically conducting shield plates 429, 430 which are attached to the cooling jackets 404, 405, respectively, by electrically insulating plastic toggles 431, the shield plates being spaced from the electrodes 401, 402 by electrically insulating spacers 432, 433, respectively. O-rings 434 provide vacuum seals between the electrode assemblies and the latter spacers, while O-rings 435 provide vacuum seals between the spacers and the shield plates. The shield plates 429, 430 which are electrically grounded, serve to shield the vacuum system per se, i.e., the pumps, gages, and the like, from the r.f. plasma discharge that is trapped between the conical electrode sections.

The central portions of the shield plates include ports to permit the discharge cavity to be evacuated and to permit filling of the cavity with the working gas chosen.

Hence, the central portions may be provided with an electrically conductive screen 436, as shown on the shield plate 429, or may incorporate a wire die 437 and associated surrounding screen 438 as shown in the shield plate 430.

The wire die arrangement is used when coating wire substrates to assist in positioning the wire at a desired location within the electrode assembly. When coating more complex substrates, a suitable stinger (not shown), with the substrates mounted on the stinger, can be positioned in the discharge cavity from one end. A partial screen may then be inserted to fill the annular region between the stinger and the wall of the assembly in substantially the same manner as the screen 438 fills the region around the die 437 located in the shield plate 430.

An outer cylindrical shield 439, in the form of an electrically conductive sleeve, connects the two shield plates 429, 430 together electrically and encapsulates the entire glow discharge assembly. A similar ground shield 440 surrounds the r.f. power lines 424, 425 and is physically and electrically connected to the cylindrical shield 439. Hence, the entire discharge device is located within a Faraday type shielded cavity which keeps stray r.f. radiations from escaping to the surrounding environment.

The magnetic field coils 403 are axially spaced along and electrically insulated from the outside surface of the ground shield 439 in a solenoidal coil configuration which produces a substantially uniform magnetic field within the discharge cavity. A plurality of spacers 441, of plastic or the like, are located between the ground shield 439 and the cooling jackets 404, 405 to assist in supporting the weight of the magnetic field coils. The spacing between the ground shield 439 and the cooling jackets 404, 405 is made large enough so that the electrical capacity between them is relatively small. In this way a large impedance exists between the electrodes 401, 402 and electrical ground, and, therefore, an efficient r.f. power transfer to the plasma discharge is assured.

The entire assembly shown in FIG. 9 is connected at one end to a suitable vacuum and gas feed system (not shown). The vacuum system may incorporate suitable pass-throughs, well known in the art, so that wire, rod, strip or other elongated substrates can continually be passed through the discharge cavity for purposes of receiving a sputtered coating.

Referring now to FIGS. 10 and 10a of the drawings, there is shown an embodiment of the invention in the form of a hollow cathode discharge device 500 for coating rod and wire-like shapes, or the convex surfaces of more complex articles, with either insulating or conducting coatings. The discharge device 500 includes two coaxial, hollow, conical electrodes 501, 502 which are mounted facing one another in a substantially uniform magnetic field formed by a plurality of magnetic field coils 503 which surround the assembly. The inner target surfaces of the pair of conical electrodes 501, 502 cooperate with the magnetic field lines to form an annular plasma trap which functions substantially in the same manner as for the embodiment shown in FIG. 9. In this connection, the discharge device 500 of FIG. 10 differs from the discharge device 400 of FIG. 9 primarily in that shielding against plasma and sputtered material is provided for an electrically insulating ring 545 separating the cooling jackets and electrodes, since sputtering with an electrically conducting material is contemplated by the embodiment of FIG. 10. Hence, the reference numerals 500 through 541 in the embodiment of FIG. 10 denote like or corresponding parts indicated by the reference numerals 400 through 441, respectively, in the embodiment of the glow discharge system shown in FIG. 9.

The conical electrodes 501, 502 consist essentially of welded or bolted together assemblies which incorporate appropriate cooling jackets 504, 505 and asssociated mounting flanges 506, 507, respectively. The inner surfaces of the electrodes 501, 502 are either fabricated of the metal to be sputtered or of an easy to machine non-magnetic material, such as aluminum, stainless steel, and the like, and coated or plated with a thick layer (not shown) of the metal or insulating material to be sputtered. For example, the technique of plasma spraying can be used to apply suitably thick coatings with adequate adhesion for this application.

The cooling jacket flanges 506, 507 enable the electrodes to be bolted together by a plurality of electrically insulating bolts 508, of nylon or the like, so that the electrically insulating ring 545 can be captured between the flanges. O-ring grooves 546, 547 in the mounting flanges 506, 507, respectively, enable a vacuum seal to be formed.

As best observed in FIG. 10a, a plurality of overlapping baffles is defined by a cylindrical lip 548 extending from the electrode 502 towards the electrode 501, while a similar inner concentric cylindrical lip 549 projects towards the electrode 502 from either the electrode 501 or the cooling jacket 504. The lips 548, 549 shield the insulating ring 545 from the plasma discharge and from the flux of sputtered material, so that the ring does not become overheated and, in the case of sputtered conductive material, the inner face of the ring does not receive a metallic coating that could cause the electrodes to be short-circuited electrically.

It will be apparent from the foregoing descriptions that the comhination of electrode pairs and a suitably shaped magnetic field in a system having axial symmetry is used to provide a trap for primary electrons which restricts their motions both radially and axially, thereby causing them to remain near the target surfaces until a large fraction of their energy has been expended in ionizing collisions. The closed plasma containing trap is formed on some sides by the magnetic fields and on the remaining sides by the electrode surfaces which may or may not include end wing configurations depending upon the space required for the primary electrons to lose their useful ionizing energy.

It will also be apparent that, while substrates to be coated are normally spaced outside of the plasma to avoid undue heating, substrates may, if desired, be deliberately bathed with plasma for heating purposes.

As mentioned previously, one of the principal advantages of the present invention is that relatively low operating pressures can be used. This use of relatively low pressures for the working gas results in an essentially straight line emission of the sputtered material from the target and, hence, line of sight sputtering onto a substrate. In contrast, where high operating pressures are involved, such as in typical prior art apparatus, the sputtered material becomes gas scattered and tends to move in other than a line of sight direction. As a consequence, some of the sputtered material is turned back to the cathode and the deposition rate is reduced. In addition, the gas scattering coats not only the particular surface of a substrate facing the target, but may also coat other surfaces, such as the sides and rear, depending upon the orientation of the substrate with respect to the target.

The use of relatively low pressures also enables a large area of deposition. This occurs because the mean free path or average length of collisionless line of sight motion of the sputtered material varies inversely with the pressure. Hence, a sputtering system in accordance with the invention can be operated at relatively low pressures and thereby permit substrates located at large radii to still see a line of sight flux of coating material. Therefore, the invention permits the use of large chambers with attendant large deposition areas. For example, an exemplary radius for a vacuum chamber use in accordance with the present invention is typically 18 inches, but the operating pressure cn be made low enough so that the chamber size can be increased to place the substrates even 30 inches away from the target without undergoing serious departures from the line of sight flux of the sputtered material. With average electrode diameters typically in the range of 3 to 6 inches, satisfactory stable operation can be obtained for pressures ranging from approximately 0.5 microns to in excess of 20 microns. Working gas pressures in the range of 0.5 microns to 1 micron appear to be preferable. An exemplary length for the double electrode configuration is from several inches to several feet, a typical operating length being 2 feet.

It will further be apparent that glow discharge systems constructed in accordance with the present invention possess the very significant advantage of being scalable. In this regard, the diameter and length of the target electrodes can be readily changed over a wide dimensional range while still obtaining satisfactory operation.

Since the invention permits operation at such low working gas pressures that sputtered material from all points along a target electrode length can reach a given substrate position with line of sight trajectories, it is possible to analytically predict with considerable accuracy what the influence would be of baffles placed between the target electrodes and the substrate. Accordingly, such baffles can be used to deposit coatings with controlled gradations in coating thickness and to extend the substrate area over which uniform coating thicknesses are obtained.

Another advantage of the glow discharge technique of the present invention is the ability to operate at a relatively low voltage. Since the sputtering yield (atoms sputtered per incident ion) increases less than linearly for higher ion energies, more sputtering is obtained at low voltage operation for a given power input than at high voltage operation. In addition, low voltage, high current operation means that higher power levals can be delivered to the sputtering apparatus without costly insulation problems in the design of power supplies and the sputtering equipment per se. In the usual pripr art sputtering apparatus, the applied voltage is approximately 3,000 volts, necessitating great care in providing proper insulation. On the other hand, depending upon the particular target material chosen, and particularly whether it is electrically conductive or a dielectric material, the typical range of operating voltages with apparatus constructed in accordance with the present invention is from approximately 300 volts to 2200 volts, with 1100 volts being typical for a hollow cathode configuration sputtering an aluminum oxide dielectric. The working gas pressure can be increased several times without significantly affecting the operating voltage required.

An additional advantage is that substrate heating is held to a minimum where desired, because there is very small plasma bombardment. This results because the plasma is contained around the target electrodes. Therefore, the apparatus can be used with substrate materials that melt or off-gas easily. In addition, the apparatus of the present invention can be used to deliberately bathe the substrate in plasma by either moving the substrate to the plasma region or reducing the magnetic field strength to enable primary electrons to reach the substrate.

A further advantage is that the overall system provided by the present invention is electricaly very stable and can be dependably operated for many hours with minimum drift in electrical operating parameters.

Typical yields with systems of the present invention, from a double electrode, hollow cathode configuration, using conical cathodes with an average diameter of 5 inches and a total length for both electrodes of approximately 24 inches, with an r.f. frequency of 1.8 megacycles, 0.70 microns working gas pressure, and 5 kilowatts r.f. power input at 1160 volts rms across both the plasma and the target electrodes, provide an average deposition rate for an aluminum oxide ceramic cathode surface of 200 Angstroms per minute.

The method and apparatus of the present invention provide a plasma trap of such sufficiency that the replenishing requirements for sustaining a plasma within the trap are minimized to the point that the burden normally placed on the target as a cathode does not interfere in any subsantial way with the sputtering process. Hence, coupling between the process of sustaining an intense plasma discharge over the target surface, and the sputtering process itself, is minimized. Therefore, the invention removes the requirements for any assist discharge, second power supply, and other like disadvantages of prior art discharge systems affecting efficiency, yield, cost, complexity and the like. In this regard, the present invention satisfies a long existing need for improved glow discharge systems and techniques for such applications as sputtering, polymerization, vapor deposition, light sources, radiation sources, cathodic etching, and any other application requiring the generation of plasma or a flux of sputtered material.

It will be apparent from the foregoing that, while particular forms of the invention have been illustrated and described, various modifications can be made without departing from the spirit and scope of the invention. Accordingly, it is not intended that the invention be limited except as by the appended claims.

We claim:

1. A method of generating a glow discharge, comprising the steps of:
   supporting a pair of planar electrodes within a working gas environment;
   applying electrical voltage across said electrodes; and
   forming a magnetic field which defines, together with said electrodes, at least one trap for containing substantially all electrons emitted from said electrodes and having sufficient energy to further ionize said working gas.

2. A method as set forth in claim 1, wherein said electrodes are coplanar.

3. A method as set forth in claim 1, and further including:
   maintaining said working gas environment at a pressure of 1 micron or less.

4. A method as set forth in claim 1, wherein said voltage is an r.f. voltage.

5. A method as set forth in claim 1, wherein said trap has axial symmetry about an axis of rotation, 6. A method as set forth in claim 1, wherein said electrodes include a sputtering surface comprised of an electrically conductive material.

7. A method as set forth in claim 1, wherein said electrodes include a sputtering surface comprised of an electrically insulating material.

8. A method as set forth in claim 1, wherein said electrodes are coaxial.

9. Glow discharge apparatus, comprising:
a pair of planar electrodes;
mounting means for supporting said electrodes in close, spaced apart relationship in a low pressure working gas environment;
power supply means for supplying an electrical voltage across said pair of electrodes; and
magnetic field means for forming a magnetic field which defines with said electrodes at least one completely closed trap for containing substantially all electrons emitted from said electrodes and having sufficient energy to further ionize said working gas.

10. Apparatus as set forth in claim 9, wherein one of said electrodes is a disc and the other of said electrodes is a ring concentric with said disc.

11. Apparatus as set forth in claim 10 wherein said electrodes are coplanar.

12. A combination as set forth in claim 10, wherein said electrodes are disposed in a working gas environment at a pressure of 1 micron or less.

13. A combination as set forth in claim 10, wherein said voltage is an r.f. voltage.

14. A combination as set forth in claim 10, wherein said electrodes include a sputtering surface adapted to be comprised of an electrically conductive material.

15. A combination as set forth in claim 10, wherein said electrodes include a sputtering surface adapted to be comprised of an electrically insulating material.

16. Apparatus as set forth in claim 9, wherein each of said electrodes is semicircular 17. Apparatus as set forth in claim 16 wherein said electrodes are coplanar.

18. Apparatus as set forth in claim 9, wherein said electrodes are coplanar.

19. A combination as set forth in claim 9, wherein said electrodes are disposed in a working gas environment at a pressure of 1 micron or less.

20. A combination as set forth in claim 9, wherein said voltage is an r.f. voltage.

21. A combination as set forth in claim 9, wherein said electrodes include a sputtering surface adapted to be comprised of an electrically conductive material.

22. A combination as set forth in claim 9, wherein said electrodes include a sputtering surface adapted to be comprised of an electrically insulating material.

23. In an r.f. glow discharge system, the combination comprising:
a pair of planar electrodes; and
means for forming a magnetic field which defines with said electrode assembly at least one completely closed trap for containing substantially all electrons emitted from said electrodes and having sufficient energy to create additional ions.

24. Apparatus as set forth in claim 23 wherein one of said electrodes is a disc and the other of said electrodes is a ring concentric with said disc.

25. Apparatus as set forth in claim 23, wherein each of said electrodes is semicircular.

* * * * *

UNITED STATES PATENT AND TRADEMARK OFFICE
CERTIFICATE OF CORRECTION

PATENT NO. : 4,116,793                          Page 1 of 2
DATED      : September 26, 1978
INVENTOR(S) : Alan S. Penfold and John A. Thornton It is certified that error appears in the above-identified patent and that said Letters Patent are hereby corrected as shown below:

Column 4, line 35, delete "conventinually" and insert therefor -- conventionally --.

Column 8, line 51, delete "33" and insert therefor -- 3e --;
line 55, delete "Two" and insert therefor -- The --.

Column 9, line 40, delete "in" and insert therefor -- into --.

Column 17, line 29, delete "wall" and insert therefor -- well --;
line 32, delete "305" and insert therefor -- 306 --.

Column 19, line 42, delete "pluraity" and insert therefor -- plurality --.

Column 20, line 25, delete "406a" and insert therefor -- 405a --.

Column 21, line 4, delete "in" and insert therefor -- on --.

Column 22, line 8, delete "asss" and insert therefor -- ass --;
line 38, delete "comhination" and insert therefor -- combination --.

UNITED STATES PATENT AND TRADEMARK OFFICE
CERTIFICATE OF CORRECTION

PATENT NO. : 4,116,793

DATED : September 26, 1978

INVENTOR(S) : Alan S. Penfold and John A. Thornton

It is certified that error appears in the above-identified patent and that said Letters Patent are hereby corrected as shown below:

Column 23, line 56, delete "pripr" and insert therefor
-- prior --.

Column 24, line 13, delete "electricaly" and insert therefor
-- electrically --;
line 32, delete "subsantial" and insert therefor
-- substantial --.

Signed and Sealed this

Twenty-seventh Day of November 1979

[SEAL]

Attest:

RUTH C. MASON
Attesting Officer

LUTRELLE F. PARKER
Acting Commissioner of Patents and Trademarks